US009620544B2

(12) United States Patent
Chung et al.

(10) Patent No.: US 9,620,544 B2
(45) Date of Patent: Apr. 11, 2017

(54) IMAGE SENSOR DEVICE

(71) Applicant: Powerchip Technology Corporation, Hsinchu (TW)

(72) Inventors: Chih-Ping Chung, Hsinchu (TW); Ming-Wei Chen, Changhua County (TW); Ming-Yu Ho, Taichung (TW)

(73) Assignee: Powerchip Technology Corporation, Hsinchu (TW)

( * ) Notice: Subject to any disclaimer, the term of this patent is extended or adjusted under 35 U.S.C. 154(b) by 0 days.

(21) Appl. No.: 14/846,845

(22) Filed: Sep. 7, 2015

(65) Prior Publication Data
US 2017/0033147 A1  Feb. 2, 2017

(30) Foreign Application Priority Data
Jul. 30, 2015 (TW) .............................. 104124668 A

(51) Int. Cl.
*H01L 31/0232* (2014.01)
*H01L 21/00* (2006.01)
*H01L 27/146* (2006.01)
*H01L 33/10* (2010.01)

(52) U.S. Cl.
CPC .... *H01L 27/14629* (2013.01); *H01L 27/1463* (2013.01); *H01L 33/10* (2013.01)

(58) Field of Classification Search
CPC .......................... H01L 27/14629; H01L 33/10
USPC ....................... 257/432–437, 447; 438/69–72
See application file for complete search history.

(56) References Cited

U.S. PATENT DOCUMENTS

| 5,952,645 | A | * | 9/1999 | Wang | ................ | H01L 27/14627 |
| | | | | | | 250/208.1 |
| 7,193,289 | B2 | * | 3/2007 | Adkisson | .......... | H01L 21/76819 |
| | | | | | | 257/431 |
| 7,524,690 | B2 | * | 4/2009 | Ko | .................... | H01L 27/14621 |
| | | | | | | 438/31 |
| 7,982,177 | B2 | * | 7/2011 | Nozaki | ............. | H01L 27/14625 |
| | | | | | | 250/239 |
| 9,373,732 | B2 | * | 6/2016 | Velichko | ........... | H01L 31/02327 |
| | | | | | | 438/72 |
| 2005/0274871 | A1 | * | 12/2005 | Li | ..................... | H01L 27/14601 |
| | | | | | | 250/208.1 |
| 2008/0151728 | A1 | | 6/2008 | Yusu | | |

FOREIGN PATENT DOCUMENTS

TW    200512548       4/2005
TW    201130118 A1   9/2011

* cited by examiner

*Primary Examiner* — Calvin Lee
(74) *Attorney, Agent, or Firm* — Winston Hsu; Scott Margo

(57) ABSTRACT

An image sensor device includes a substrate having a pixel array region, isolation structures in the substrate separating pixel regions from one another in the pixel array region, a photo-sensing region in each of the pixel regions, and a reflective cavity structure in the substrate within each of the pixel region. The reflective cavity structure continuously extends from a bottom of the isolation structure to a deeper central portion of each of the pixel regions, thereby forming a dish-like profile. The reflective cavity structure has a reflective index smaller than that of the substrate.

10 Claims, 14 Drawing Sheets

IMAGE SENSOR DEVICE

CROSS REFERENCE TO RELATED APPLICATION

This application claims the benefit of Taiwan patent application No. 104124668, filed on Jul. 30, 2015, the disclosure of which is incorporated herein in its entirety by reference.

BACKGROUND OF THE INVENTION

1. Field of the Invention

The present invention relates generally to a semiconductor image sensor device and, more particularly, to a front-side illuminated (FSI) CMOS image sensor (CIS) device having an in-substrate reflective cavity structure and a fabrication method thereof.

2. Description of the Prior Art

Complementary metal oxide semiconductor (CMOS) image sensor has been widely used in, for example, security monitoring, digital cameras, toys, cell phones, video phones and other imaging products. With smart phones and tablet PCs become thinner, lighter, and more complicate, CMOS image sensor needs to continue to reduce the size and improve the resolution.

Generally, a CMOS image sensor comprises a plurality of pixels arranged in a pixel array. Each pixel typically has a photodiode fabricated within a semiconductor substrate. The incident light can be converted to a current signal.

As the size of the CMOS image sensor continues to shrink, the spacing between two adjacent pixels also decreases. The incident light causes increased optical scattering noise between the pixels, leading to reduced quantum efficiency (QE) and photosensitivity. The decreased spacing between two adjacent pixels also results in severe optical crosstalk. The aforesaid optical interference makes the spatial resolution and the overall sensitivity of the image sensor difficult to improve, and will produce color mixing, which causes the image noise.

Therefore, there remains a need in the art for an improved CMOS image sensor structure, which is capable of solving the problem and the drawback of the prior art, in particular, to improve the optical crosstalk between pixels, and improve the quantum efficiency.

SUMMARY OF THE INVENTION

It is therefore one object of the invention to provide an improved front-side illuminated (FSI) CMOS image sensor (CIS) device, which is capable of avoiding optical interference between pixels and enhancing the sensitivity and quantum efficiency of the image sensor device.

According to one embodiment of the invention, an image sensor device includes a substrate having a pixel array region, isolation structures in the substrate separating pixel regions from one another in the pixel array region, a photo-sensing region in each of the pixel regions, and a reflective cavity structure in the substrate within each of the pixel region. The reflective cavity structure continuously extends from a bottom of the isolation structure to a deeper central portion of each of the pixel regions, thereby forming a dish-like profile. The reflective cavity structure has a reflective index smaller than that of the substrate.

According to one embodiment of the invention, an image sensor device includes a substrate having a pixel array region comprising therein a plurality of pixel regions; a reflection layer structure disposed at a predetermined depth in the substrate within each of the pixel regions; a plurality of isolation structures in the substrate separating the pixel regions from one another in the pixel array region; and a photo-sensing region in the substrate within each of the pixel regions. The reflection layer structure has a reflective index smaller than that of the substrate.

These and other objectives of the present invention will no doubt become obvious to those of ordinary skill in the art after reading the following detailed description of the preferred embodiment that is illustrated in the various figures and drawings.

DETAILED DESCRIPTION

The present invention pertains to a front-side illuminated (FSI) CMOS image sensor (CIS) device, which is capable of avoiding optical interference between pixels and enhancing the sensitivity and quantum efficiency of the image sensor device.

Figure 1:
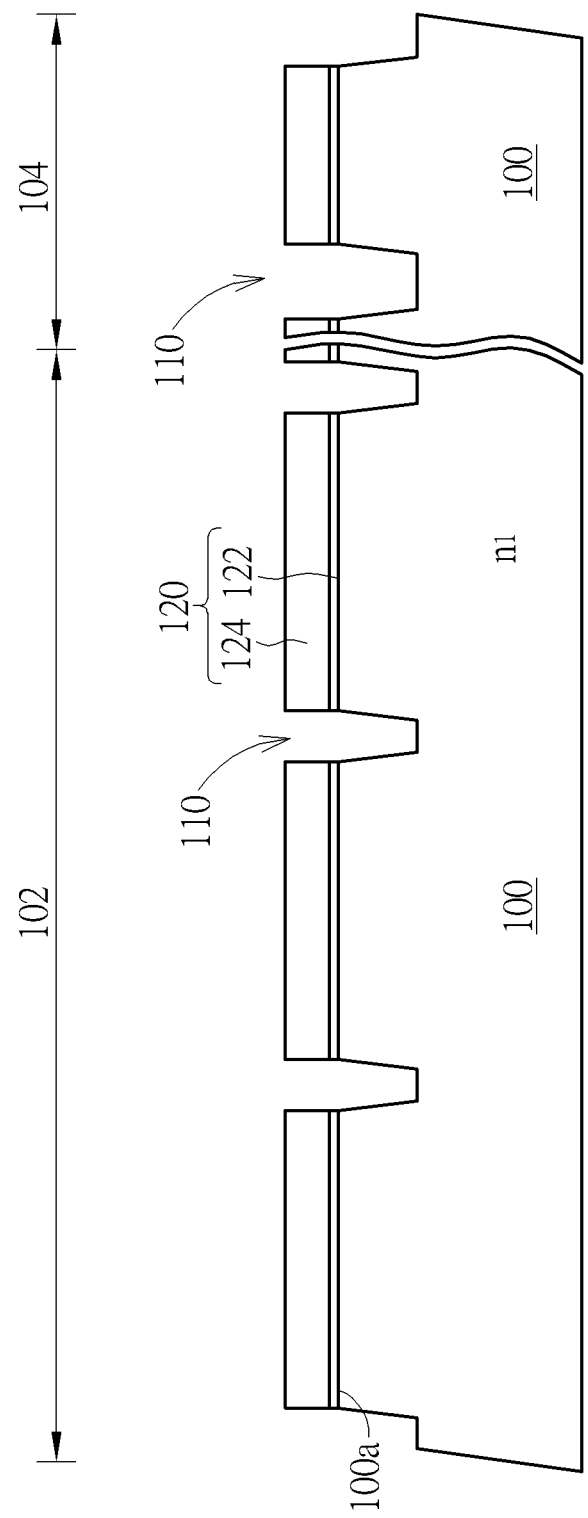
FIG. 1 to FIG. 7 are schematic, cross-sectional diagrams showing a method for fabricating a CMOS image sensor in accordance with one embodiment of the invention.

Please refer to FIG. 1 to FIG. 7. FIG. 1 to FIG. 7 are schematic, cross-sectional diagrams showing a method for fabricating a CMOS image sensor in accordance with one embodiment of the invention. As shown in FIG. 1, first, a substrate 100 is provided. The substrate 100 includes a pixel array region 102 and a peripheral circuit region 104. According to the embodiment of the invention, the substrate 100 may be a silicon substrate with a refractive index ($n_1$) of about 4.5, but not limited thereto.

Subsequently, a patterned hard mask layer 120 is formed on the substrate 100. Using the patterned hard mask layer 120 as an etching mask, a dry etching process is carried out to etch the substrate 100, thereby forming a plurality of trenches 110 in the substrate 100. The patterned hard mask layer 120 may comprise a single layer or multi-layer structure. For example, the patterned hard mask layer 120 may comprise a silicon oxide layer 122 and a silicon nitride layer 124, but not limited thereto.

Figure 2:
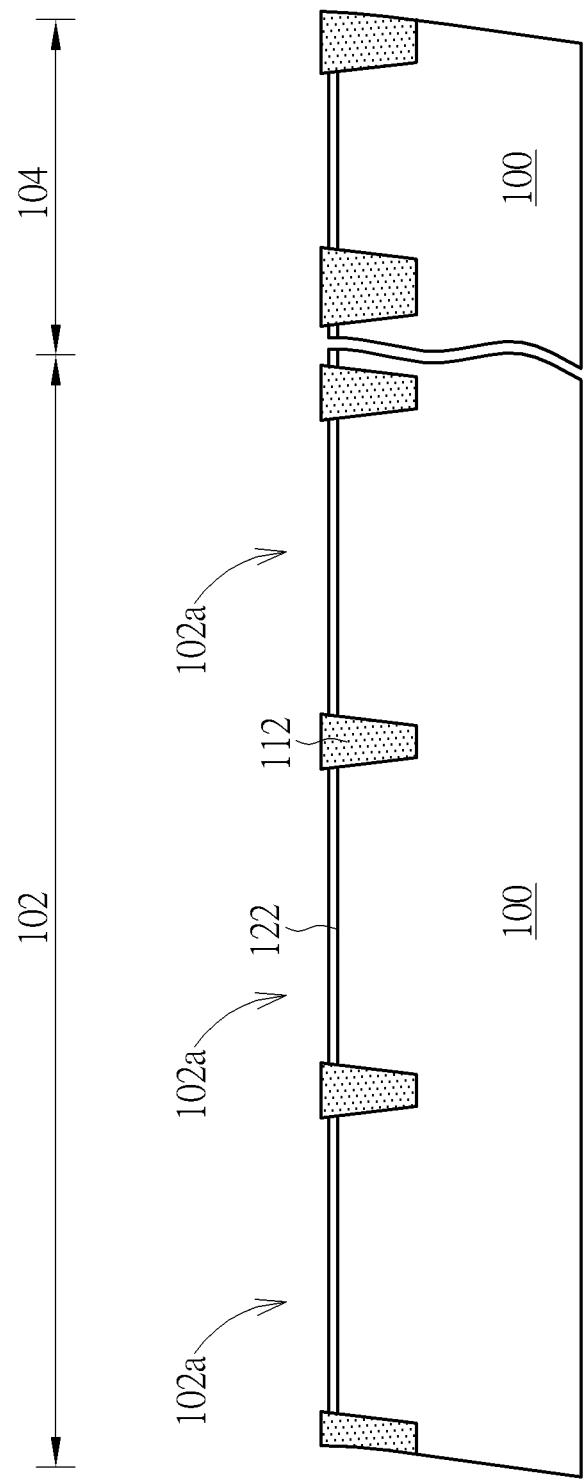

As shown in FIG. 2, a plurality of isolation structures 112 are formed within the trenches 110, respectively, to thereby separate the pixel regions 102a, for example, red (R) pixels, green (G) pixels, and blue (B) pixels, from one another. For example, a high-density plasma (HDP) oxide layer may be first deposited on the substrate 100. The HDP oxide layer is then subjected to a polishing process using the patterned hard mask layer 120 as a polishing stop layer, but not limited thereto. According to the embodiment of the invention, after forming the isolation structures 112, at least the silicon nitride layer 124 of the patterned hard mask layer 120 is removed.

Figure 3:
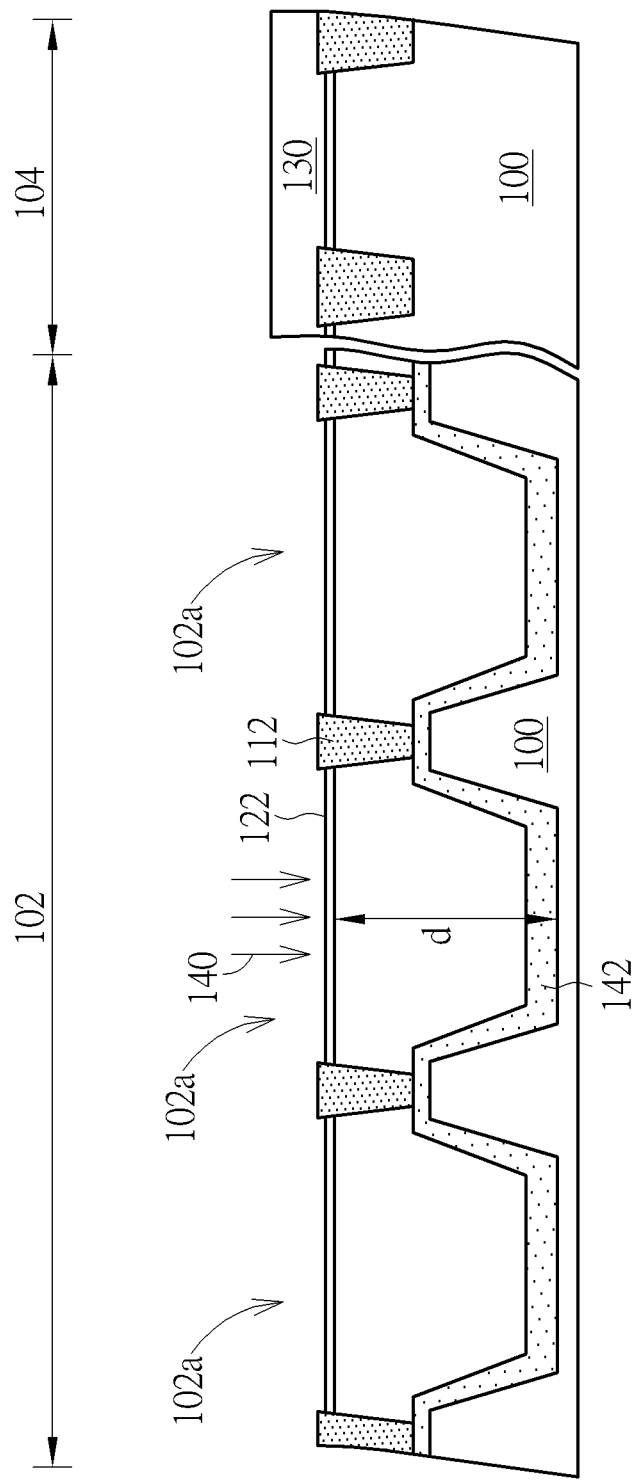

As shown in FIG. 3, a patterned photoresist layer 130 is formed on the substrate 100. The patterned photoresist layer 130 covers the peripheral circuit region 104 and reveals the pixel array region 102. Subsequently, an ion implantation process 140 is performed to form a doping region 142 with a predetermined doping profile in the substrate 100 within the pixel array region 102. The patterned photoresist layer 130 is then removed.

During the ion implantation process 140, the silicon oxide layer 122 may function as a screen layer that avoids the damage to the surface of the substrate 100. The ion implantation process 140 may be an oxygen ion implantation process and the doping region 142 may be an oxygen ion doping region, but not limited thereto. In other embodiments, other dopants, for example, nitrogen, may be employed. In other embodiments, two or more than two kinds of dopants may be employed, for example, oxygen and nitrogen.

Since the isolation structures 112 in the pixel array region 102, the oxygen ions are implanted to various depth in the substrate 100 during the ion implantation process 140, to thereby form the aforesaid predetermined doping profile. For example, the doping region 142 has a shallower doping depth directly under the isolation structures 112, and it continuously extends to a deeper region at a middle area of each pixel region 102a, thereby forming a disk shaped or bowl shaped doping profile within each pixel region 102a. According to the embodiment of the invention, the depth d of the doping region 142 at a middle area of each pixel region 102a may be greater than or equal o 6000 angstroms.

Figure 4:
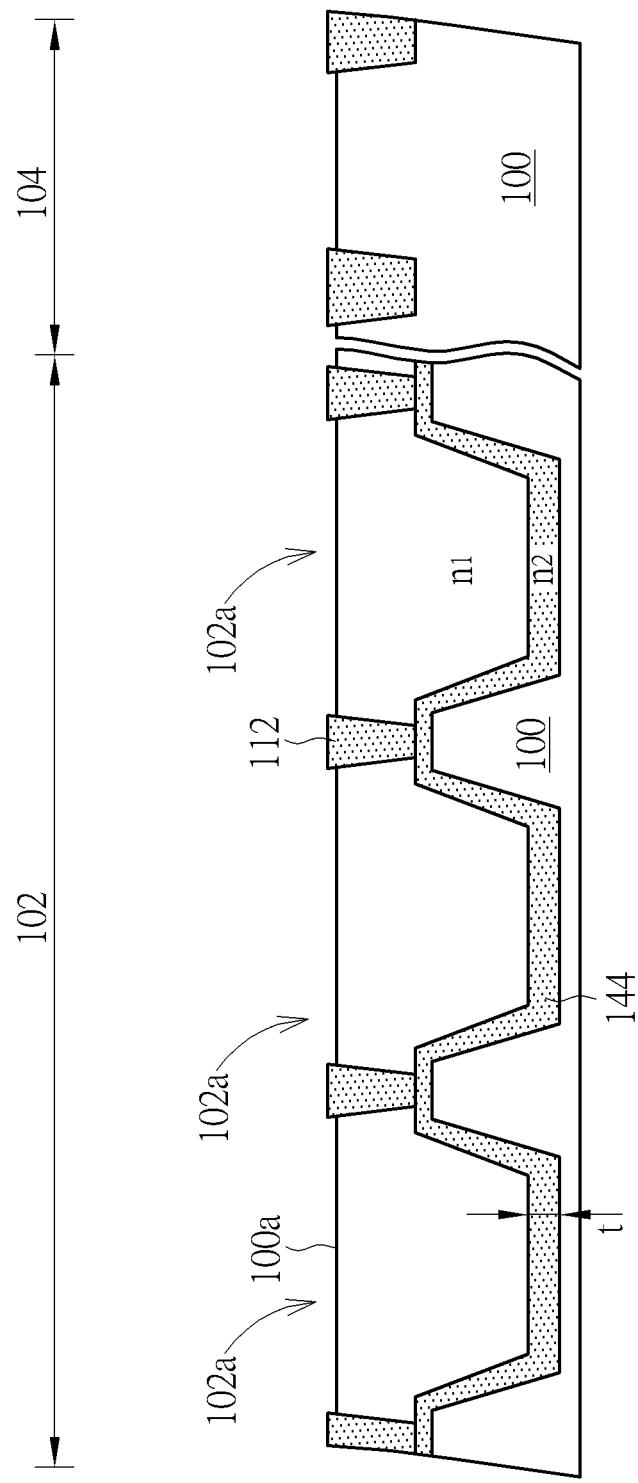

As shown in FIG. 4, after the ion implantation process 140, an anneal process, for example, at a high temperature above 850° C., may be performed to densify the HDP oxide layer and make the dopants in the doping region 142 react with the silicon atoms, thereby transforming the doping region 142 into a reflective cavity structure 144 having a thickness t ranging between 20 and 1000 angstroms. Likewise, the reflective cavity structure 144 continuously extends from a shallower portion directly under the isolation structures 112 to the deeper portion at the middle region of each pixel region 102a, to thereby form a disk shaped or bowl shaped profile. Subsequently, the silicon oxide layer 122 is removed. According to the embodiment of the invention, the reflective cavity structure 144 may be indirect contact with the bottom of the isolation structures 112, but not limited thereto. In other embodiments, the reflective cavity structure 144 may not be in direct contact with the bottom of the isolation structures 112.

According to the embodiment of the invention, the reflective cavity structure 144 may be composed of silicon dioxide having a refractive index ($n_2$) of about 1.5. Therefore, the refractive index of the reflective cavity structure 144 is smaller than that of the surrounding substrate 100, and a large difference of the refractive index between the substrate 100 and the reflective cavity structure 144 may be present. In other embodiments, the reflective cavity structure 144 may be composed of other materials, for example, silicon oxynitride, silicon nitride, or the like.

Figure 5:
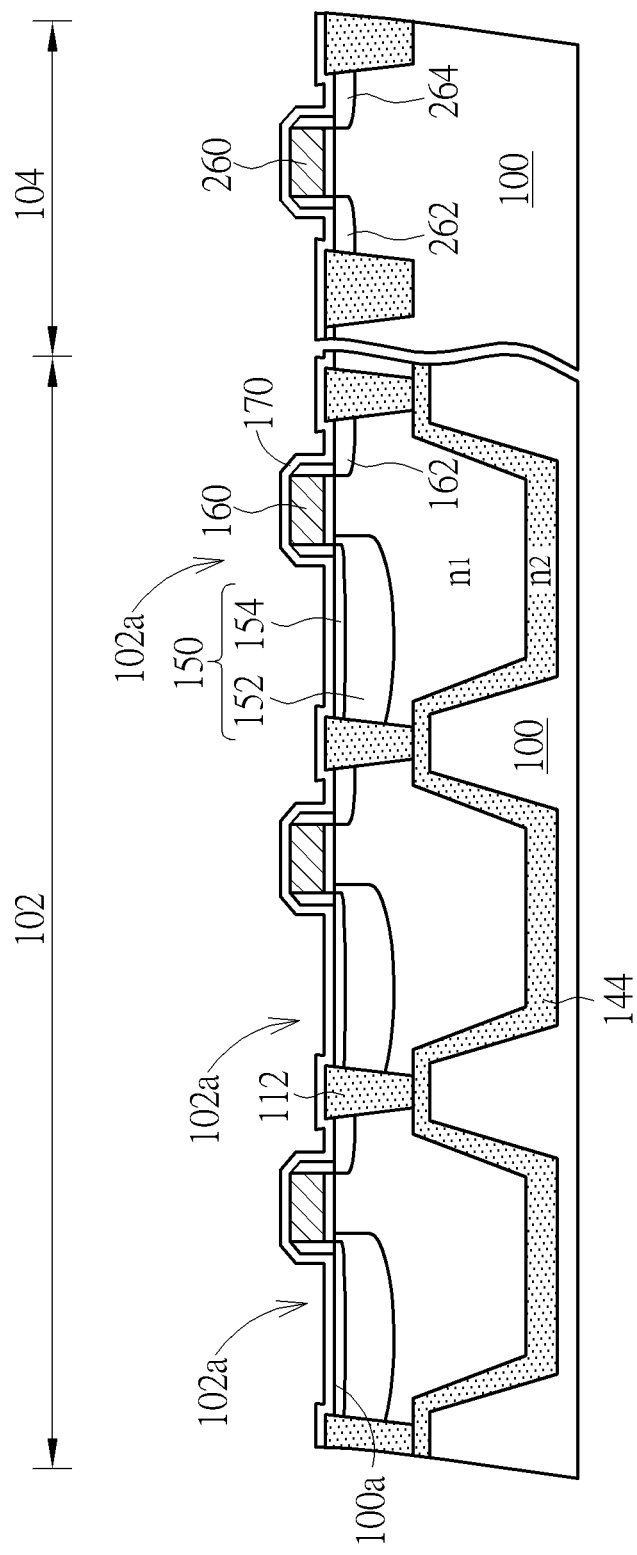

As shown in FIG. 5, gate structures 160, 260 are formed on the substrate 100 within each pixel region 102a and peripheral circuit region 104 respectively. Subsequently, photo-sensing region 150 and floating drain region 162 may be formed in the substrate 100 on two opposite sides of each gate structure 160. Source region 262 and drain region 264 may be formed in the substrate 100 on two opposite sides of each gate structure 260. The gate structures 160, 260 may comprise a dielectric layer and a conductive layer. The dielectric layer may comprise silicon oxide and the conductive layer may comprise crystalline silicon, undoped polysilicon, doped polysilicon, amorphous silicon, metal silicide, or any combinations thereof. Spacers such as silicon oxide spacer, silicon nitride space or a combination thereof may be formed on sidewalls of the gate structures 160, 260.

The photo-sensing region 150 may be a photodiode comprising a first conductivity type doping region 152 and a second conductivity type doping region 154, wherein the first conductivity type is opposite to the second conductivity type. For example, the substrate 100 is a P type substrate, the first conductivity type doping region 152 is an N type doping region, the second conductivity type doping region 154 is a P type doping region, the floating drain region 162, the source region 262 and the drain region 264 are N type doping regions, and vice versa. For example, the first conductivity type doping region 152 may be a lightly doping region, the second conductivity type doping region 154, the floating drain region 162, the source region 262 and the drain region 264 may be heavily doping regions.

According to the embodiment of the invention, a contact etching stop layer (CESL) 170 may be conformally deposited on the substrate 100, but not limited thereto. The contact etching stop layer 170 may comprise silicon nitride.

Figure 6:
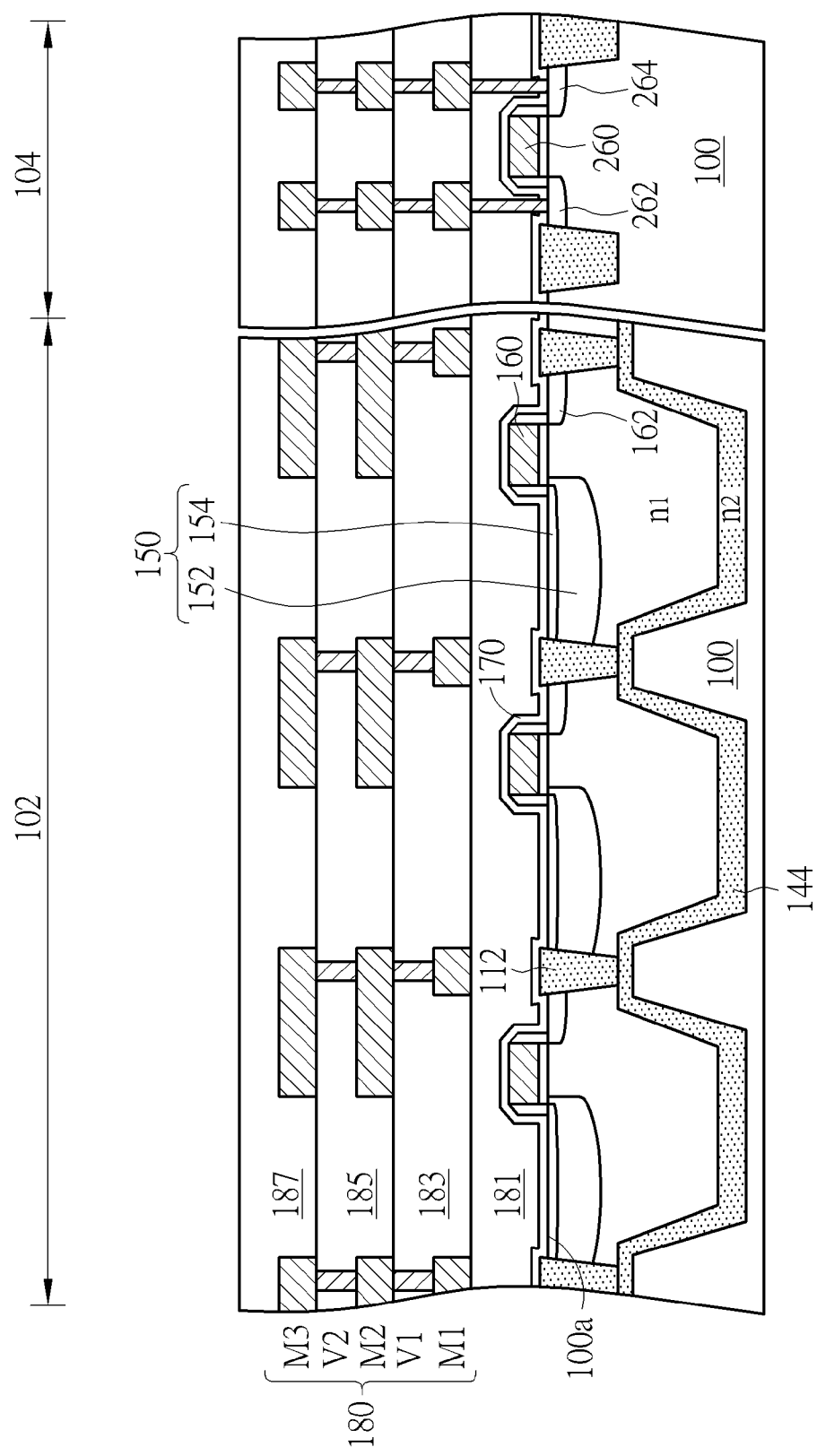

As shown in FIG. 6, subsequently, an interconnection structure 180 comprising, for example, at least one dielectric layer and at least one conductive layer, is formed on the substrate 100 within the pixel array region 102 and the peripheral circuit region 104. The dielectric layer may comprise silicon dioxide, but not limited thereto. The conductive layer may comprise aluminum or copper, but not limited thereto. According to the embodiment of the invention, the interconnection structure 180 may comprise dielectric layers 181, 183, 185, 187. According to the embodiment of the invention, the interconnection structure 180 may comprise conductive layers $M_1$, $V_1$, $M_2$, $V_2$, $M_3$. The conductive layers $M_1$, $M_2$, $M_3$ may be circuit layers. The conductive layer $V_1$ may be a via plug connecting conductive layer $M_1$ to conductive layer $M_2$. The conductive layer $V_2$ may be a via plug connecting conductive layer $M_2$ to conductive layer $M_3$. According to the embodiment of the invention, the conductive layers $M_1$, $V_1$, $M_2$, $V_2$, $M_3$ within the pixel array region 102 may be fabricated directly above the isolation structures 112 for reducing the light scattering of the incident light.

Figure 7:
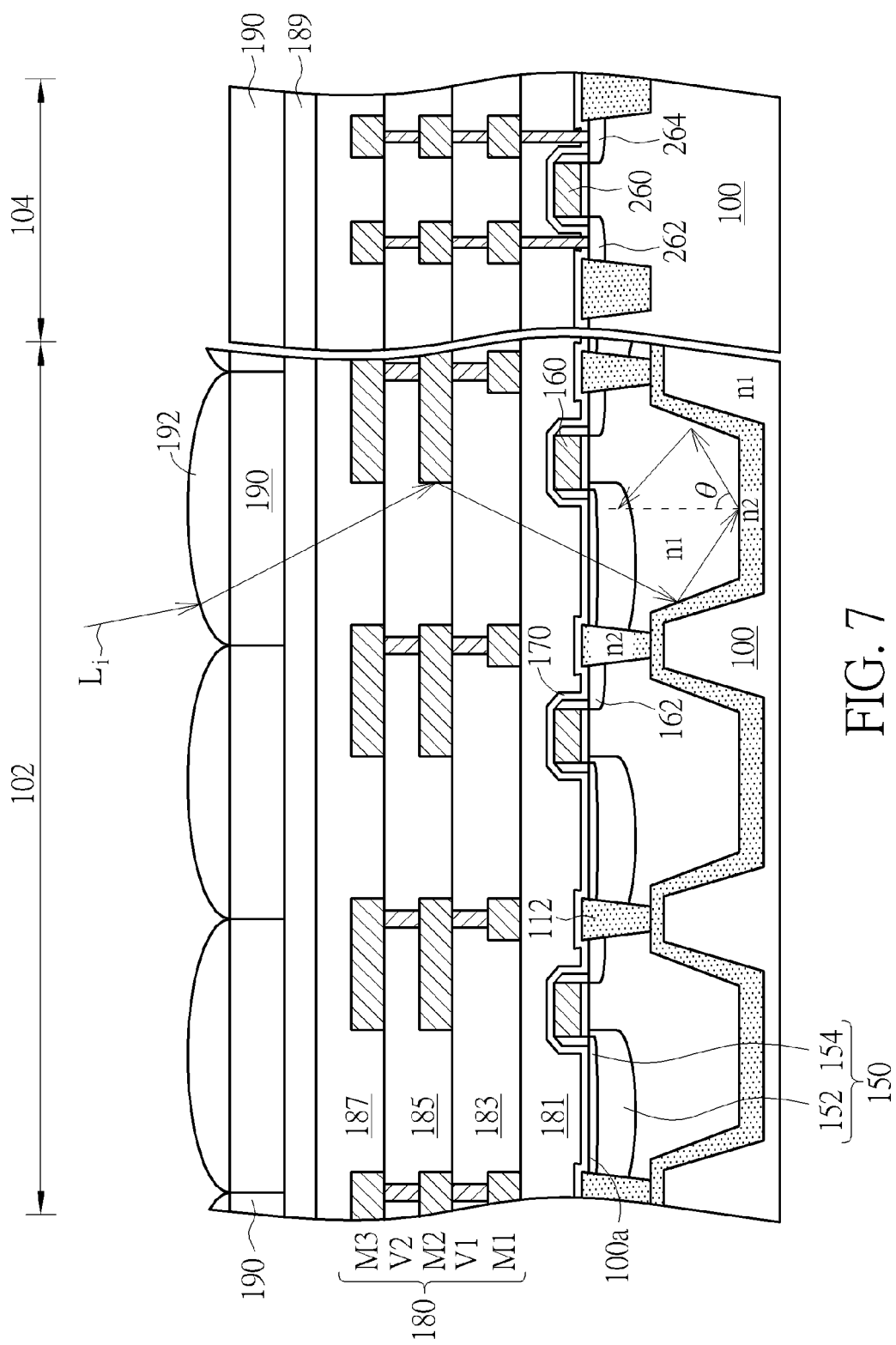

As shown in FIG. 7, a passivation layer 189 is formed on the dielectric layer 187. Subsequently, a color filter layer 190 is formed on the passivation layer 189. According to the embodiment of the invention, the color filter layer 190 may cover the pixel array region 102 and the peripheral circuit region 104. The fabrication method for making the color filter layer 190 is well known in the art and therefore the details will be omitted. Subsequently, a micro lens 192 is formed on the color filter layer 190 within the pixel array region 102.

Because of the large difference of refractive index between the reflective cavity structure 144 and the substrate 100, total reflection occurs at the interface between reflective cavity structure 144 and the substrate 100 when the incident light $L_i$ enters the substrate 100. The reflected light is accordingly guided back to the photo-sensing region 150, thereby increasing the quantum efficiency. In addition, the reflective cavity structure 144 may be used to isolate noise from other pixels and reduce light interference between pixels, thereby increasing the sensitivity of each pixel.

Please refer to FIG. 8 to FIG. 14. FIG. 8 to FIG. 14 are schematic, cross-sectional diagrams showing a method for fabricating a CMOS image sensor in accordance with another embodiment of the invention, wherein like numeral numbers designate like regions, elements, or layers.

Figure 8:
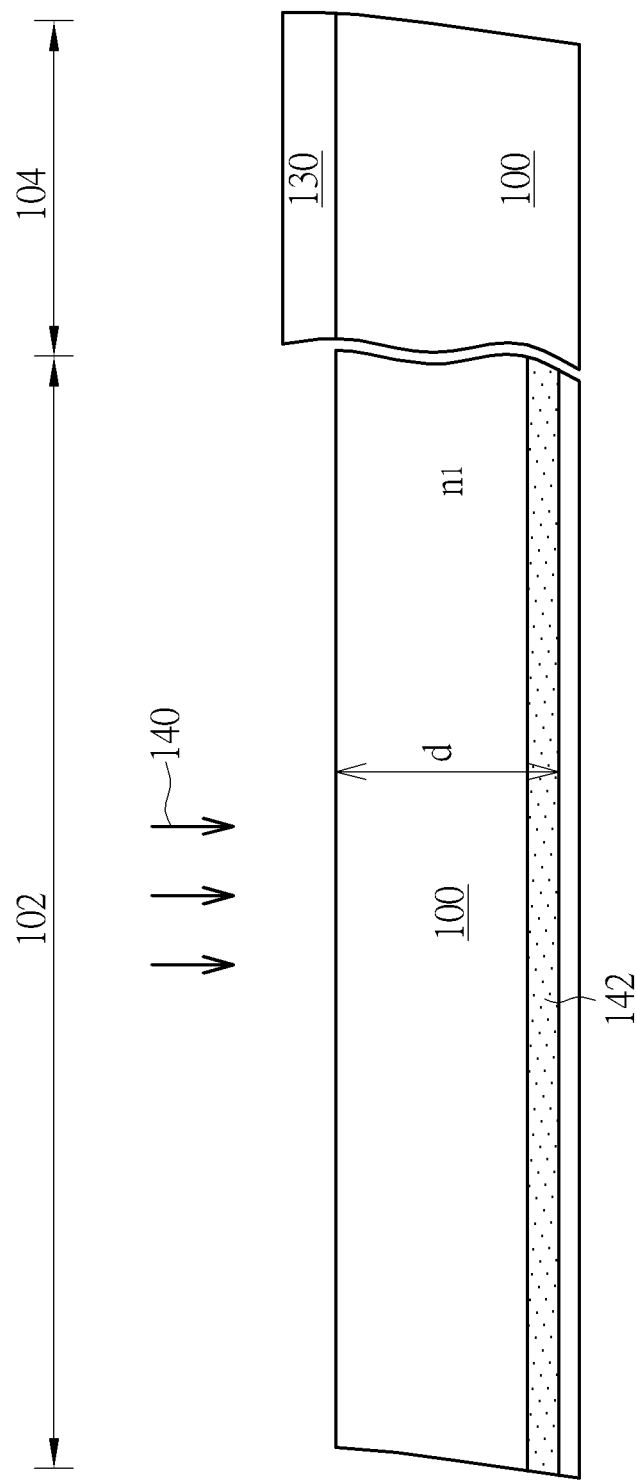
FIG. 8 to FIG. 14 are schematic, cross-sectional diagrams showing a method for fabricating a CMOS image sensor in accordance with another embodiment of the invention.

As shown in FIG. 8, likewise, a substrate 100 is provided. The substrate 100 includes a pixel array region 102 and a peripheral circuit region 104. According to the embodiment of the invention, the substrate 100 may be a silicon substrate with a refractive index ($n_1$) of about 4.5, but not limited thereto. Subsequently, a patterned photoresist layer 130 is formed on the substrate 100. The patterned photoresist layer 130 covers the peripheral circuit region 104 and only reveals the pixel array region 102. Thereafter, an ion implantation process 140 is performed to form a doping region 142 with predetermined depth in the substrate 100 within the pixel array region 102. The patterned photoresist layer 130 is then removed.

According to the embodiment of the invention, the ion implantation process 140 may be an oxygen ion implantation process and the doping region 142 may be an oxygen ion doping region, but not limited thereto. In other embodiments, other dopants, for example, nitrogen or the like, may be employed. In other embodiments, two or more than two kinds of dopants may be employed, for example, oxygen and nitrogen.

According to the embodiment of the invention, the doping region 142 may continuously extend across and cover the entire the pixel array region 102. According to the embodiment of the invention, the doping region 142 may have substantially the same depth d in the substrate 100. For example, the depth d of the doping region 142 may be greater than or equal to 6000 angstroms.

Figure 9:
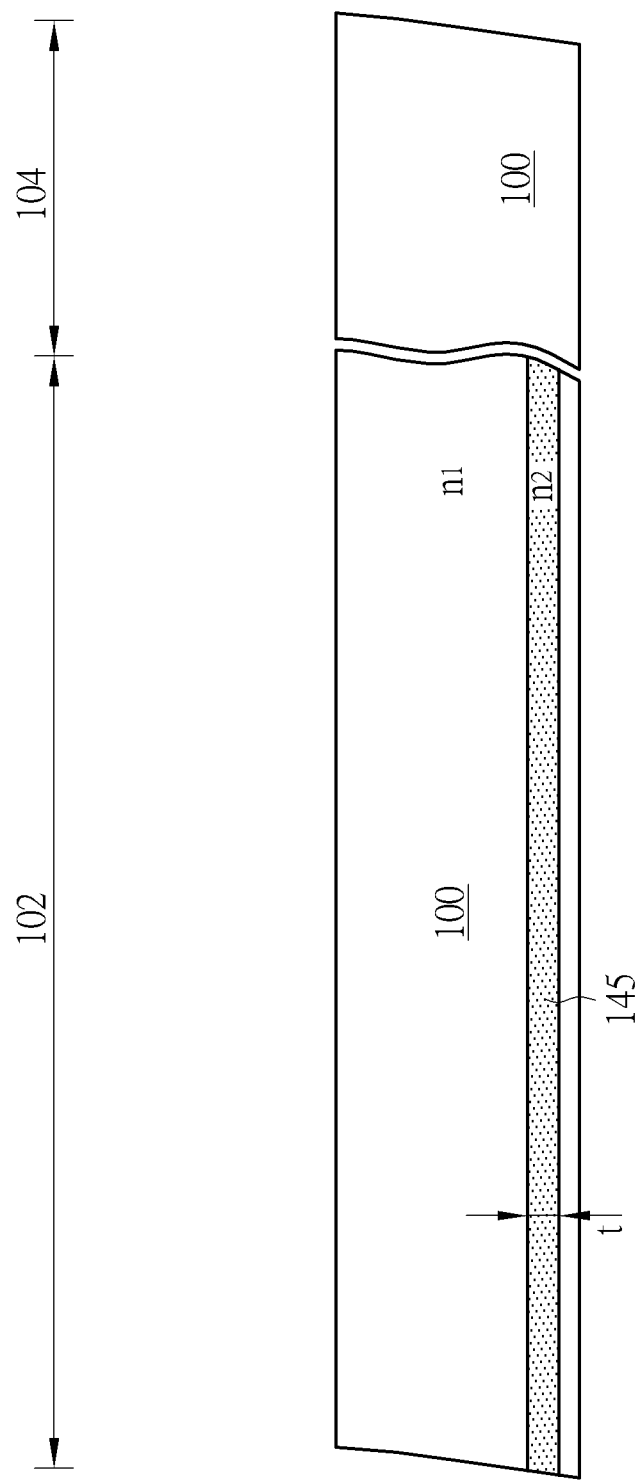

As shown in FIG. 9, after the ion implantation process 140, an anneal process, for example, at a high temperature above 850° C., may be performed to make the dopants in the doping region 142 react with the silicon atoms, thereby transforming the doping region 142 into a reflective layer structure 145 having a thickness t ranging between 20 and 1000 angstroms. According to the embodiment of the invention, the reflective layer structure 145 may be composed of silicon dioxide having a refractive index $(n_2)$ of about 1.5. Therefore, the refractive index of the reflective cavity structure 145 is smaller than that of the surrounding substrate 100, and a large difference of the refractive index between the substrate 100 and the reflective layer structure 145 may be present. In other embodiments, the reflective layer structure 145 may be composed of other materials, for example, silicon oxynitride, silicon nitride, or the like.

Figure 10:
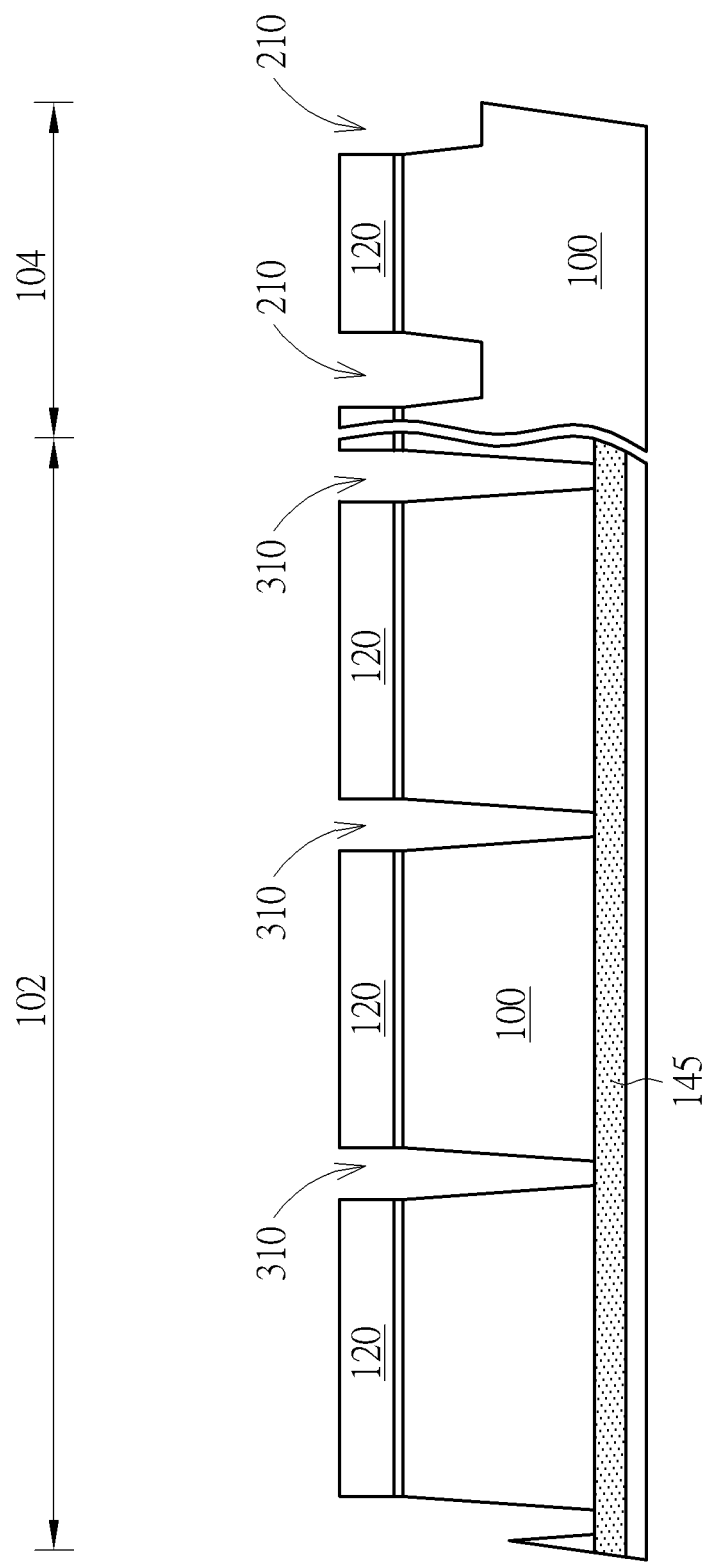

As shown in FIG. 10, a patterned hard mask layer 120 is then formed on the substrate 100. Subsequently, using the patterned hard mask layer 120 as an etching hard mask, an etching process is performed to etch the substrate 100 not covered by the patterned hard mask layer 120, thereby forming a plurality of first trenches 210 in the substrate 100 within the peripheral circuit region 104 and forming a plurality of second trenches 310 in the substrate 100 within the pixel array region 102. According to the embodiment of the invention, the second trenches 310 have a depth that is deeper than that of the first trenches 210, but not limited thereto. In other embodiments, the second trenches 310 may have the same depth as that of the first trenches 210. The patterned hard mask layer 120 may comprise single layer or multi-layer structure. For example, the patterned hard mask layer 120 may comprise a silicon oxide layer 122 and a silicon nitride layer 124, but not limited thereto.

The methods for forming trenches in the substrate 100 having two different trench depths are well known in the art, and the details are therefore omitted. For example, a photoresist pattern (not shown) may be formed to cover the peripheral circuit region 104 when forming the second trenches 310, and then an etching process is performed to etch the substrate 100 not covered by the photoresist pattern 120 until the reflective layer structure 145 is revealed. According to the embodiment of the invention, the reflective layer structure 145 may act as an etching stop layer.

Figure 11:
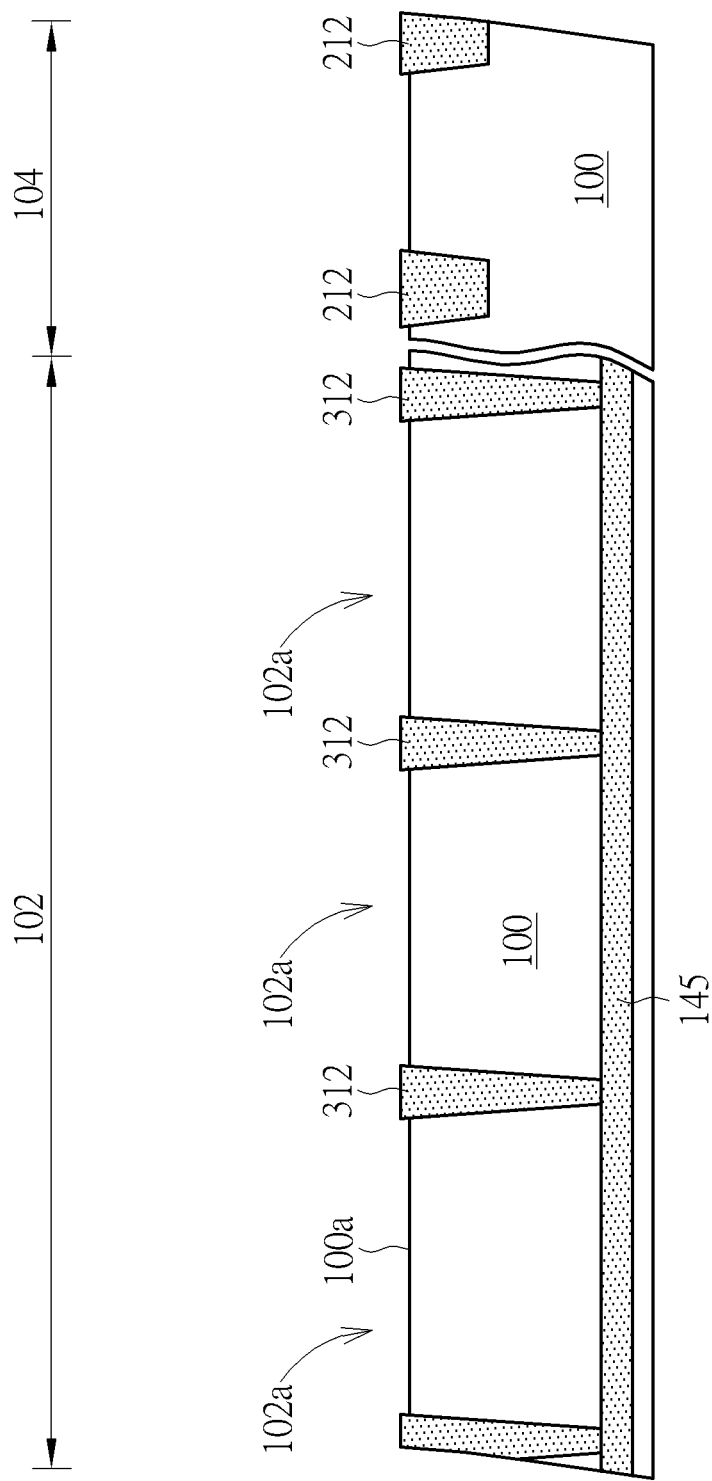

As shown in FIG. 11, a plurality of isolation structures 212, 312 are formed within the first trenches 210, 310 respectively. The isolation structures 312 may be contiguous with the underlying reflective layer structure 145, thereby separating the pixel regions 102a, for example, red (R) pixels, green (G) pixels, and blue (B) pixels, from one another in the pixel array region 102. For example, a high-density plasma (HDP) oxide layer may be first deposited on the substrate 100. The HDP oxide layer is then subjected to a polishing process using the patterned hard mask layer 120 as a polishing stop layer, but not limited thereto. According to the embodiment of the invention, after forming the isolation structures 212, 312, the patterned hard mask layer 120 may be removed.

Figure 12:
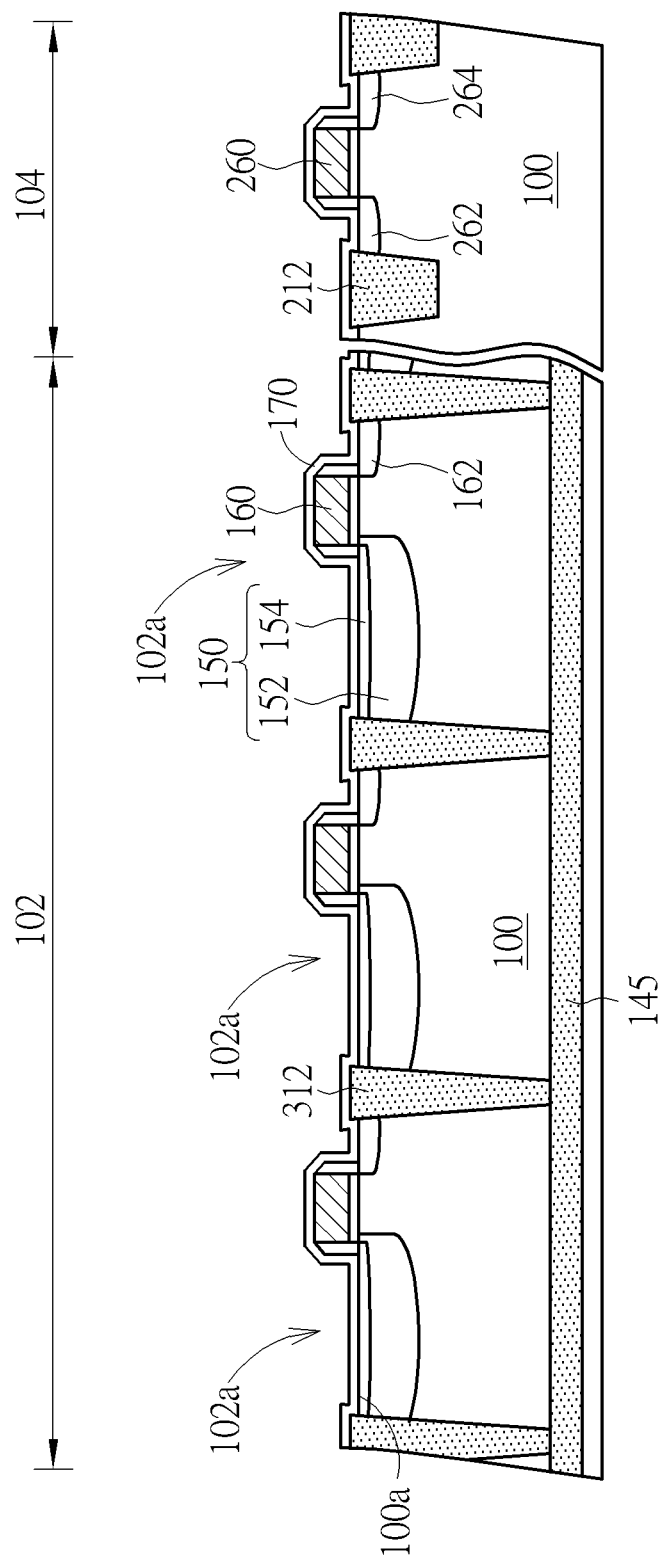

As shown in FIG. 12, gate structures 160, 260 are formed on the substrate 100 within each pixel region 102a and peripheral circuit region 104 respectively. Subsequently, photo-sensing region 150 and floating drain region 162 may be formed in the substrate 100 on two opposite sides of each gate structure 160. Source region 262 and drain region 264 may be formed in the substrate 100 on two opposite sides of each gate structure 260. The gate structures 160, 260 may comprise a dielectric layer and a conductive layer. The dielectric layer may comprise silicon oxide and the conductive layer may comprise crystalline silicon, undoped polysilicon, doped polysilicon, amorphous silicon, metal silicide, or any combinations thereof. Spacers such as silicon oxide spacer, silicon nitride space or a combination thereof may be formed on sidewalls of the gate structures 160, 260.

The photo-sensing region 150 may be a photodiode comprising a first conductivity type doping region 152 and a second conductivity type doping region 154, wherein the first conductivity type is opposite to the second conductivity type. For example, the substrate 100 is a P type substrate, the first conductivity type doping region 152 is an N type doping region, the second conductivity type doping region 154 is a P type doping region, the floating drain region 162, the source region 262 and the drain region 264 are N type doping regions, and vice versa. For example, the first conductivity type doping region 152 may be a lightly doping region, the second conductivity type doping region 154, the floating drain region 162, the source region 262 and the drain region 264 may be heavily doping regions.

According to the embodiment of the invention, a contact etching stop layer (CESL) 170 may be conformally deposited on the substrate 100, but not limited thereto. The contact etching stop layer 170 may comprise silicon nitride.

Figure 13:
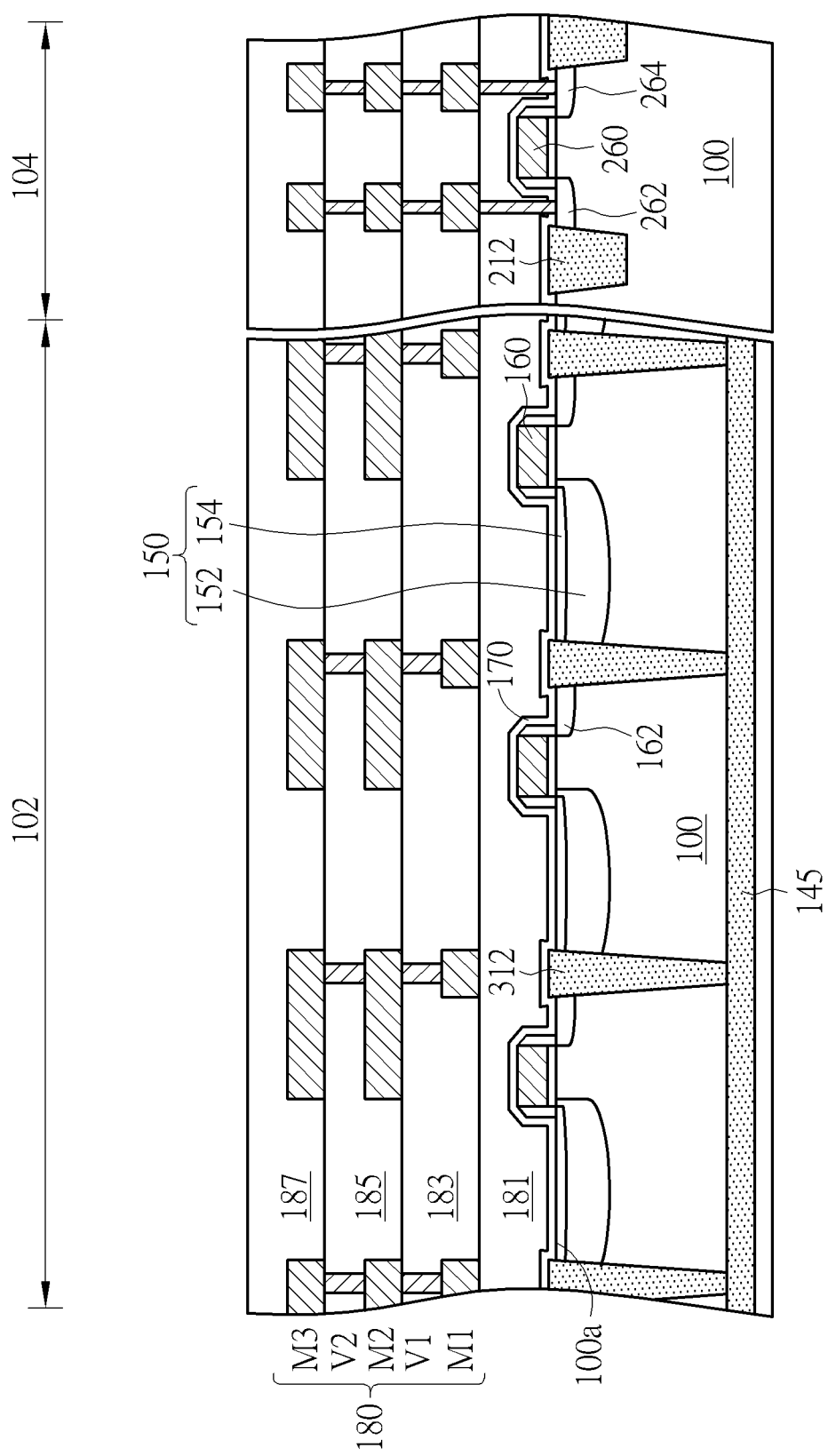

As shown in FIG. 13, subsequently, an interconnection structure 180 comprising, for example, at least one dielectric layer and at least one conductive layer, is formed on the substrate 100 within the pixel array region 102 and the peripheral circuit region 104. The dielectric layer may comprise silicon dioxide, but not limited thereto. The conductive layer may comprise aluminum or copper, but not limited thereto. According to the embodiment of the invention, the interconnection structure 180 may comprise dielectric layers 181, 183, 185, 187. According to the embodiment of the invention, the interconnection structure 180 may comprise conductive layers $M_1$, $V_1$, $M_2$, $V_2$, $M_3$. The conductive layers $M_1$, $M_2$, $M_3$ may be circuit layers. The conductive layer $V_1$ may be a via plug connecting conductive layer $M_1$ to conductive layer $M_2$. The conductive layer $V_2$ may be a via plug connecting conductive layer $M_2$ to conductive layer $M_3$. According to the embodiment of the invention, the conductive layers $M_1$, $V_1$, $M_2$, $V_2$, $M_3$ within the pixel array region 102 may be fabricated directly above the isolation structures 112 for reducing the light scattering of the incident light.

Figure 14:
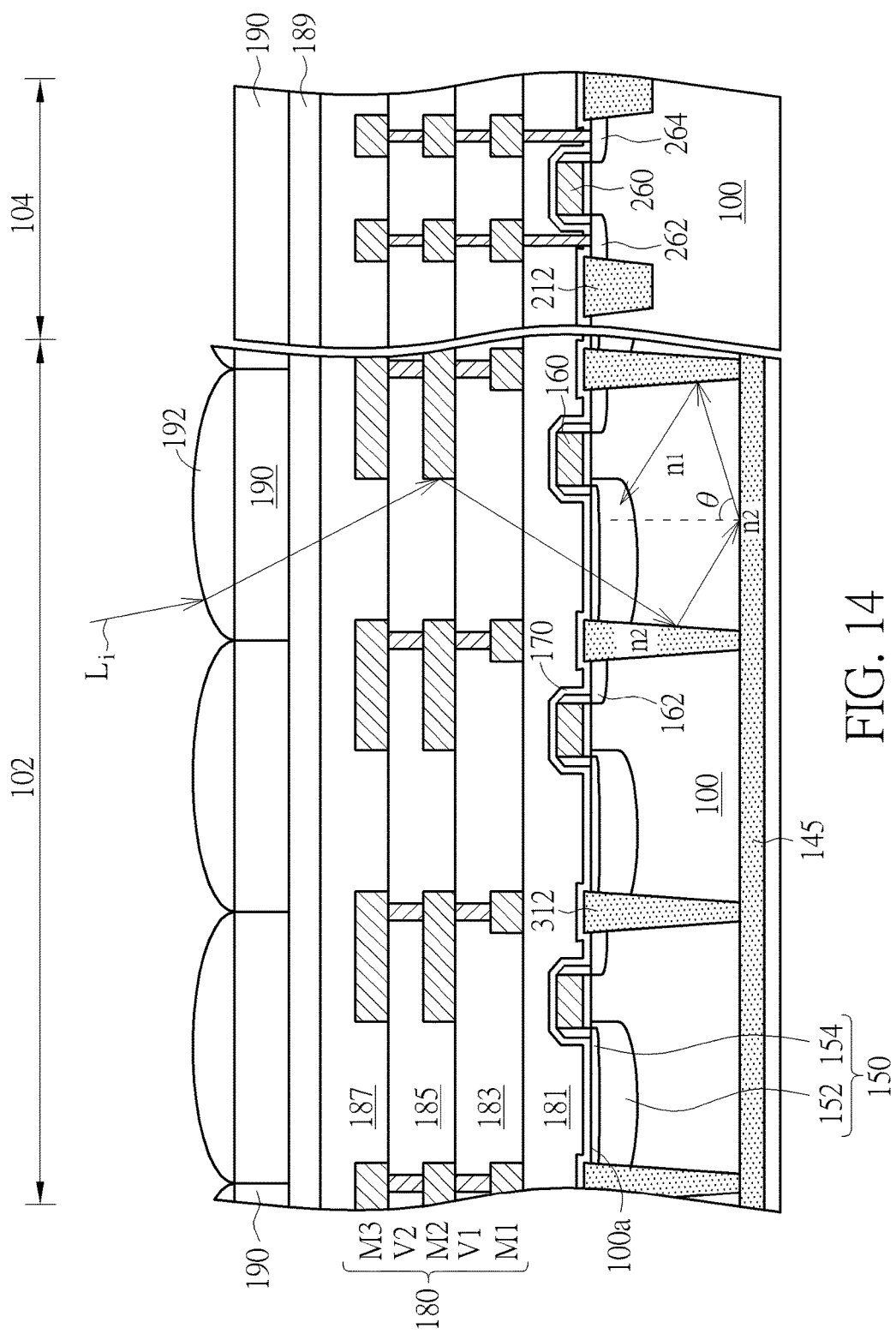

As shown in FIG. 14, a passivation layer 189 is formed on the dielectric layer 187. Subsequently, a color filter layer 190 is formed on the passivation layer 189. According to the embodiment of the invention, the color filter layer 190 may cover the pixel array region 102 and the peripheral circuit region 104. The fabrication method for making the color filter layer 190 is well known in the art and therefore the details will be omitted. Subsequently, a micro lens 192 is formed on the color filter layer 190 within the pixel array region 102.

Because of the large difference of refractive index between the reflective layer structure 145 and the substrate 100 and between the isolation structures 312 and the substrate 100, total reflection occurs at the interface between reflective layer structure 145 and the substrate 100 and between the isolation structures 312 and the substrate 100 when the incident light $L_i$ enters the substrate 100. The reflected light is accordingly guided back to the photo-sensing region 150, thereby increasing the quantum efficiency. In addition, the reflective layer structure 145 may be used to isolate noise from other pixels and reduce light interference between pixels, thereby increasing the sensitivity of each pixel.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An image sensor device, comprising:
   a substrate having a pixel array region;
   a plurality of isolation structures in the substrate separating pixel regions from one another in the pixel array region;
   a photo-sensing region in the substrate within each of the pixel regions; and
   a reflective cavity structure under the photo-sensing region in the substrate within each of the pixel regions, wherein the reflective cavity structure continuously extends from a bottom of the isolation structure to a deeper central portion of each of the pixel regions, thereby forming a dish-like profile, and wherein the reflective cavity structure has a reflective index smaller than that of the substrate.

2. The image sensor device according to claim 1, wherein the reflective cavity structure has a thickness ranging between 20~1000 angstroms.

3. The image sensor device according to claim 1, wherein the reflective cavity structure is in direct contact with a bottom of each of the isolation structures.

4. The image sensor device according to claim 1, wherein the reflective cavity structure is not in direct contact with a bottom of each of the isolation structures.

5. The image sensor device according to claim 1, wherein the photo-sensing region comprises a photodiode.

6. The image sensor device according to claim 1, wherein the substrate is a silicon substrate and the reflective cavity structure comprises a silicon oxide layer in the silicon substrate.

7. The image sensor device according to claim 6, wherein the substrate has a refractive index of 4.5 and the reflective cavity structure has a refractive index of 1.5.

8. The image sensor device according to claim 1 further comprising an interconnection structure disposed on the substrate.

9. The image sensor device according to claim 8, wherein the interconnection structure comprises at least one dielectric layer and at least one conductive layer.

10. The image sensor device according to claim 8 further comprising a color filter layer disposed on the interconnection structure, and a micro lens on the color filter layer.

* * * * *